United States Patent [19]

Kajihara et al.

[11] Patent Number: 5,559,483

[45] Date of Patent: Sep. 24, 1996

[54] TWO-PORT TRIPLE-MODE SAW RESONATORS PARALLEL CONNECTED INTO A SAW FILTER ON A SUBSTRATE

[75] Inventors: Ryuuji Kajihara; Yasushi Yamamoto, both of Tokyo, Japan

[73] Assignee: NEC Corporation, Tokyo, Japan

[21] Appl. No.: 292,038

[22] Filed: Aug. 18, 1994

[30] Foreign Application Priority Data

Aug. 20, 1993 [JP] Japan .................................. 5-206219

[51] Int. Cl.⁶ .................................................. H03H 9/64
[52] U.S. Cl. ...................... 333/195; 333/194; 310/313 D; 310/313 R
[58] Field of Search .................................. 333/193–196; 310/313 R, 313 B, 313 C, 313 D

[56] References Cited

U.S. PATENT DOCUMENTS

| | | | |
|---|---|---|---|
| 4,387,355 | 6/1983 | Uno et al. | 333/195 |
| 4,731,595 | 3/1988 | Wright | 333/195 |
| 4,910,426 | 3/1990 | Watanabe et al. | 310/313 C |
| 5,136,266 | 8/1992 | Niitsuma | 333/154 |
| 5,296,824 | 3/1994 | Cho et al. | 333/195 |
| 5,332,983 | 7/1994 | Peach | 333/196 |
| 5,392,013 | 2/1995 | Yamamoto et al. | 333/195 |

FOREIGN PATENT DOCUMENTS

| | | |
|---|---|---|
| 0092123 | 4/1988 | Japan . |
| 63-194406 | 8/1988 | Japan . |
| 5251986 | 9/1993 | Japan . |

OTHER PUBLICATIONS

"Composite Longitudinal Mode Resonator Type SAW Filters", Y. Yamamoto, Proceedings of the Institute of Electronics, Information, and Communication Engineers of Japan, vol. J76–A No. 2, Feb. 1993, pp. 219–226.

"SAW If Filters for Digital Mobile Communication Systems (II)–Extension of Two Dimensional Coupled Mode SAW Resonator", Y. Yamamoto et al., Proceedings to the Institute of Electronics, Information, and Communication Engineers of Japan, No. A–340.

Primary Examiner—Benny Lee
Assistant Examiner—Darius Gambino
Attorney, Agent, or Firm—Sughrue, Mion, Zinn, Macpeak & Seas

[57] ABSTRACT

In a SAW filter, first and second geometrically parallel two-port SAW resonators, each operable in triple longitudinal modes having first through third resonance peaks in a descending frequency order, are electrically parallel connected on a piezoelectric substrate to have lower and higher frequency passbands with the first and the second resonance peaks of the lower frequency passband brought into substantial coincidence in frequency with the second and the third resonance peaks of the higher frequency passband. In order to achieve the substantial coincidence, design parameters are optionally selected as regards a transducer space between input and output interdigital transducers in the first and in the second SAW resonators, numbers of pairs of interdigital electrodes of the input and the output interdigital transducers of the first and the second SAW resonators, and a reflector space between one of the input and the output interdigital transducers and an adjacent one of grating reflectors arranged on both longitudinal sides of the interdigital transducers in the first and in the second SAW resonators. The number of pairs may be 500 in each of the input and the output interdigital transducers of each SAW resonator.

8 Claims, 5 Drawing Sheets

TWO-PORT TRIPLE-MODE SAW RESONATORS PARALLEL CONNECTED INTO A SAW FILTER ON A SUBSTRATE

BACKGROUND OF THE INVENTION

This invention relates to a surface acoustic wave (SAW) filter and, more particularly, to a surface acoustic wave filter comprising a two-port surface acoustic wave resonator operable in three different longitudinal modes.

A surface acoustic wave filter of this type is disclosed in Japanese Patent Prepublication (A) No. 194,406 of 1988. This surface acoustic wave filter comprises as usual a pair of an input and an output interdigital transducer and a pair of grating reflectors on a piezoelectric substrate. A two-port surface acoustic wave resonator is thereby provided. In the manner which will later be described in greater detail, this surface acoustic wave resonator has a lower-frequency peak attenuation given by multiple reflection of a surface acoustic wave between the input and the output interdigital transducers and a higher-frequency peak attenuation resulting from internal reflection in the input and the output interdigital transducers. In effect, a frequency of the lower-frequency peak attenuation is brought into coincidence with another frequency of the higher-frequency peak attenuation in order to give a wide passband to the surface acoustic wave filter.

There are, however, several spurious resonance frequencies in and near the passband. These resonance frequencies give rise to adverse effects on widening the passband.

A little later than filing of a patent application for the above-referenced patent prepublication, a patent application was filed in Japan for a three-transducer surface acoustic wave filter. A counterpart United States patent application was issued to Takaya Watanabe and another as U.S. Pat. No. 4,910,426. According to this Watanabe et al United States patent, the surface acoustic wave filter comprises an apotized transducer. In a preferred embodiment, interdigital electrodes are used in an interdigital transducer in double electrode geometry with or without selective withdrawal or subsampling. Weighted finger electrodes are described. Moreover, details are described as regards how to make the invention. The specification of the Watanabe et al United States patent is therefore incorporated herein by reference.

An article is contributed by Yasushi Yamamoto, one of the present joint inventors, in the Japanese language to the Proceedings of the Institute of Electronics, Information, and Communication Engineers of Japan, Volume J76-A No. 2 (February 1993), pages 219 to 226, under the title in translation of "Composite Longitudinal Mode Resonator Type SAW Filters". In this article, Yamamoto refers to the surface acoustic wave resonator of the type described in the Japanese patent prepublication afresh as a composite longitudinal mode resonator (CLMR). Characteristics of the surface acoustic wave filters of such composite longitudinal mode resonator types are studied in detail.

In the meantime, Yasushi Yamamoto and Ryuuji Kajihara, the instant joint inventors, presented a paper in the Japanese language together with another to the 1993 Spring General Meeting of the Institute of Electronics, Information, and Communication Engineers of Japan, as paper No. A-340, under the title in translation of "SAW IF Filters for Digital Mobile Communication Systems (II)—Extension of Two-Dimensional Coupled Mode SAW Resonator Filters to Electrical Parallel Connection Type—". In this paper, the contributors have briefly revealed an outline of structure and results of experiments of a surface acoustic wave filter comprising a pair of two-port surface acoustic wave resonators connected electrically parallel on a piezoelectric substrate with double longitudinal modes used.

SUMMARY OF THE INVENTION

In view of the foregoing, it is an object of the present invention to provide a surface acoustic wave filter which comprises a two-port triple-mode surface acoustic wave resonator and has a wide passband.

It is another object of this invention to provide a surface acoustic wave filter which is of the type described and which has an excellent filter characteristic in the passband.

It is still another object of this invention to provide a surface acoustic wave filter which is of the type described and which has an excellent filter characteristic in a rejection band.

It is yet another object of this invention to provide a surface acoustic wave filter which is of the type described and which has an excellent filter characteristic in the rejection band near the passband.

Other objects of this invention will become clear as the description proceeds.

In accordance with this invention, there is provided a surface acoustic wave filter which comprises a pair of two-port triple-mode surface acoustic wave resonators geometrically arranged and electrically connected parallel on a piezoelectric substrate and in which each two-port triple-mode surface acoustic wave resonator comprises an input and an output interdigital transducer in a predetermined direction and a pair of grating resonators outwardly of the input and the output interdigital transducers in the predetermined direction with two higher resonance frequencies of one of the two-port triple-mode surface acoustic wave resonators brought into substantial coincidence with two lower resonance frequencies of the other of the two-port triple-mode surface wave resonators.

DESCRIPTION OF THE PREFERRED EMBODIMENT

In order to facilitate an understanding of the present invention, a conventional surface acoustic wave (SAW) filter will first be described. This surface acoustic wave filter is what is disclosed in the Japanese patent prepublication referred to heretobefore.

In the manner known in the art, the surface acoustic wave filter comprises a pair of an input and an output interdigital transducer and a pair of grating reflectors arranged on a piezoelectric substrate in a predetermined direction. Each of the interdigital transducers and the grating reflectors has a rectangular outline. The input and the output interdigital transducers are spaced apart by a space which may be called a transducer space. Each of the interdigital transducers is spaced from an adjacent one of the grating reflectors by a reflector space, comprises a plurality of pairs of interdigital electrodes, and has an aperture defined by the rectangular outline thereof. Together with grating electrodes of the grating reflectors, the interdigital electrodes are formed by electrically conductive metal films deposited on a principal surface of the piezoelectric substrate to an electrode film thickness. Surface acoustic waves propagate along the principal surface with a surface wavelength.

According to the invention disclosed in the Japanese patent prepublication, the interdigital transducers are given a conductance having a peak frequency substantially coincident with a center frequency of a reflection band of the grating reflectors. For this purpose, design parameters or resonance conditions of the surface acoustic wave filter are selected. More particularly, the interdigital electrode pairs are between 50 and 70 in number. The transducer space is rendered approximately equal to a quarter surface wavelength wide or equal to this width plus an integral multiple of a half surface wavelength. The reflector space is approximately equal to the surface wavelength wide or equal to this width plus an integral multiple of the half surface wavelength. In addition, other design parameters are selected as follows for ease of manufacture. The aperture is between 150 and 190 times the surface wavelength. The electrode film thickness is between 0.0085 and 0.014 times the surface wavelength.

According to Yamamoto article referenced hereinabove, the conventional surface acoustic wave filter of the Japanese patent prepublication is a composite longitudinal mode resonator (CLMR) with long interdigital transducers, namely, with interdigital transducers, each comprising a multiplicity of pairs of interdigital electrodes. In such a composite longitudinal mode resonators, standing waves of triple longitudinal modes are excited by resonance of first through third types. Although mechanism is different as follows, the resonance of the first to the third types looks like a fundamental mode and higher harmonics.

The first-type resonance has a first resonance peak at a higher frequency in a passband of the surface acoustic wave filter and results from multiple reflection between the interdigital transducers. The second-type resonance has a second resonance peak at a lower frequency in the passband and results from internal reflection in each interdigital transducer. The third-type resonance has a third resonance peak in the passband at a further lower frequency than the second resonance peak and results from multiple reflection between the grating reflectors.

When the transducer space is reduced, as from the half surface wavelength to 0.4 times the surface wavelength, the first resonance peak moves to a still higher frequency. The second and the third resonance peaks scarcely move. It is therefore possible to give a wider passband to the surface acoustic wave filter by a decrease in the transducer space. The third resonance peak is lower in height than the first and the second resonance peaks and is given a still lower frequency with an increase in the reflector distance.

Figure 1:
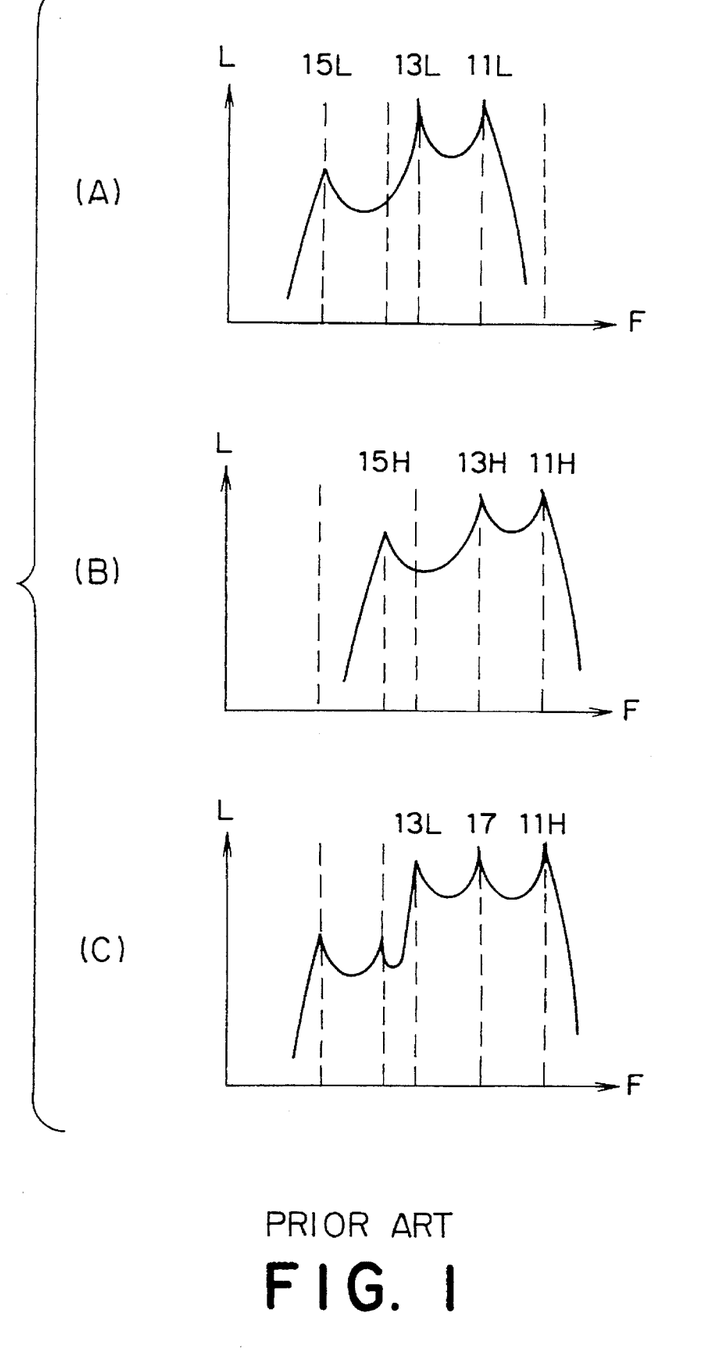
FIG. 1 schematically shows characteristics of a conventional surface acoustic wave filter as analyzed by the inventors of the instant invention.

Referring to FIG. 1, filter characteristics of the conventional surface acoustic wave filter will be described in accordance with the triple longitudinal modes of resonance described in the Yamamoto article. In FIG. 1, passband characteristics are schematically depicted at (A) with the passband given lower frequencies, at (B) with the passband given higher frequencies, and at (C) with the passband given a wide frequency band. At (A), (B), and (C), frequencies F are depicted along the abscissae. Amounts of attenuation or losses L are depicted along the ordinates.

In FIG. 1 at (A), the first through the third resonance peaks are referred to as first through third lower frequency peaks and are illustrated at 11L, 13L, and 15L. In FIG. 1 at (B), the first through the third resonance peaks are called first through third higher frequency peaks and are indicated at 11H, 13H, and 15H. From a view point of the Yamamoto article, the conventional surface acoustic wave filter is understood as a combination of two two-port triple-mode surface acoustic wave resonators having their passbands in higher and lower frequency ranges with the first lower frequency peak 11L brought into coincidence in frequency with the second higher frequency peak 13H. As a result, the conventional surface acoustic wave filter is given a wide passband which has as in FIG. 1 at (C) three resonance peaks, namely, the first higher frequency peak 11H, a coincident peak 17 of first lower frequency peak and the second higher frequency peak, and the second lower frequency peak 13L. There remain adjacent to the wide passband two conspicuous spurious resonance peaks which result from the third higher and lower frequency peaks 15H and 15L depicted at (B) and (A).

Figure 2:
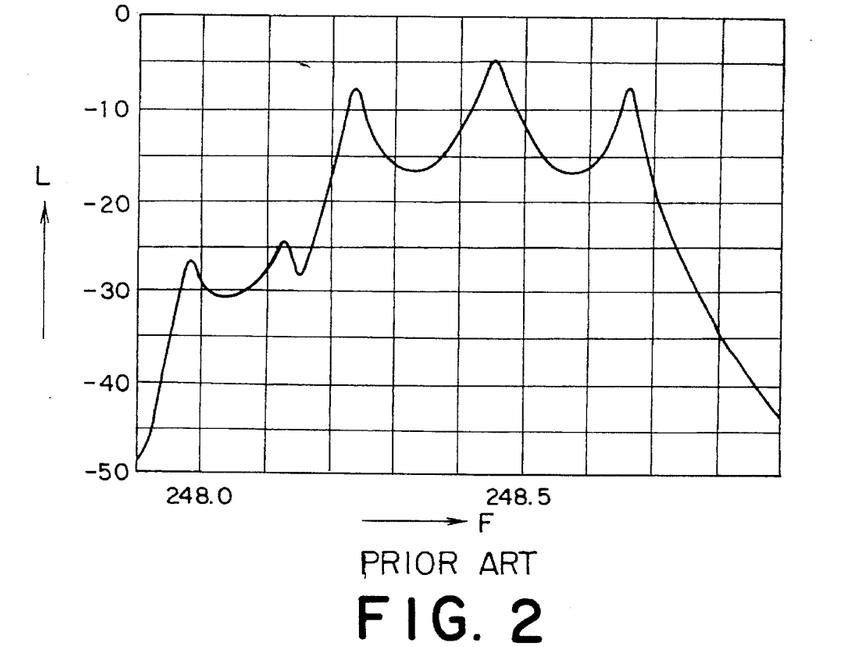
FIG. 2 shows a result of computer simulation of the characteristics illustrated in FIG. 1.
Figure 3:
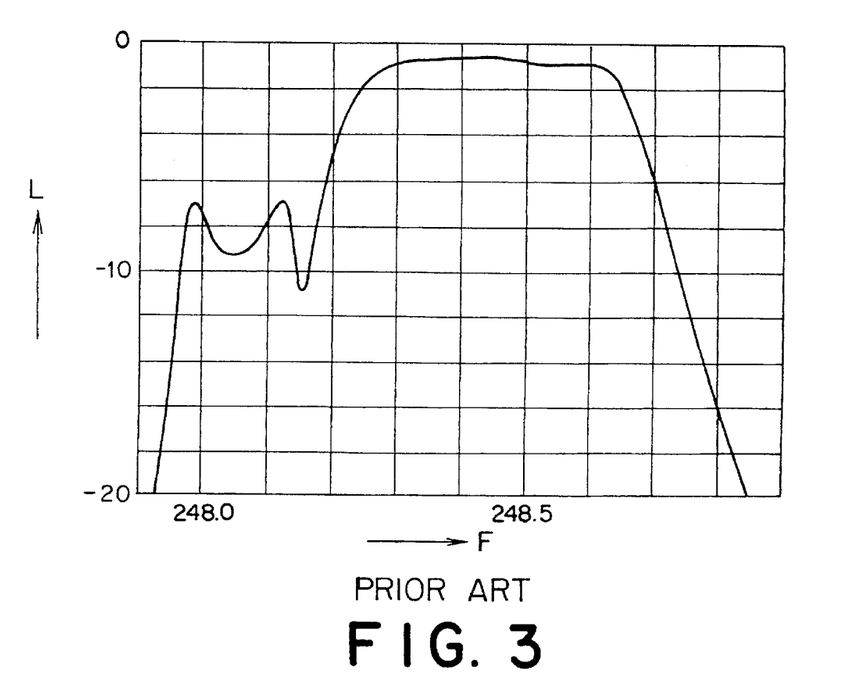
FIG. 3 shows another result of computer simulation of the characteristics depicted in FIG. 1.

Turning to FIGS. 2 and 3, results of computer simulation are illustrated in connection with such passband characteristics of the conventional surface acoustic wave filter. The frequencies F are scaled along the abscissae between 247.9 and 248.9 MHz. The losses L are scaled along the ordinates between 0 dB and −50 dB in FIG. 2 and between 0 dB and −20 dB in FIG. 3. In FIG. 2, the passband characteristic is that schematically depicted in FIG. 1 at (C). In FIG. 3, the passband characteristic is for the conventional surface acoustic wave filter to which a matching circuit is added in the manner described in the above-cited Watanabe et al United States patent.

As pointed out heretobefore, a few spurious resonance peaks appear in or near the passband. In FIGS. 2 and 3, the spurious resonance peaks result from the multiple reflection between the grating reflectors. This adversely affects smooth and excellent passband or rejection band characteristics.

Figure 4:
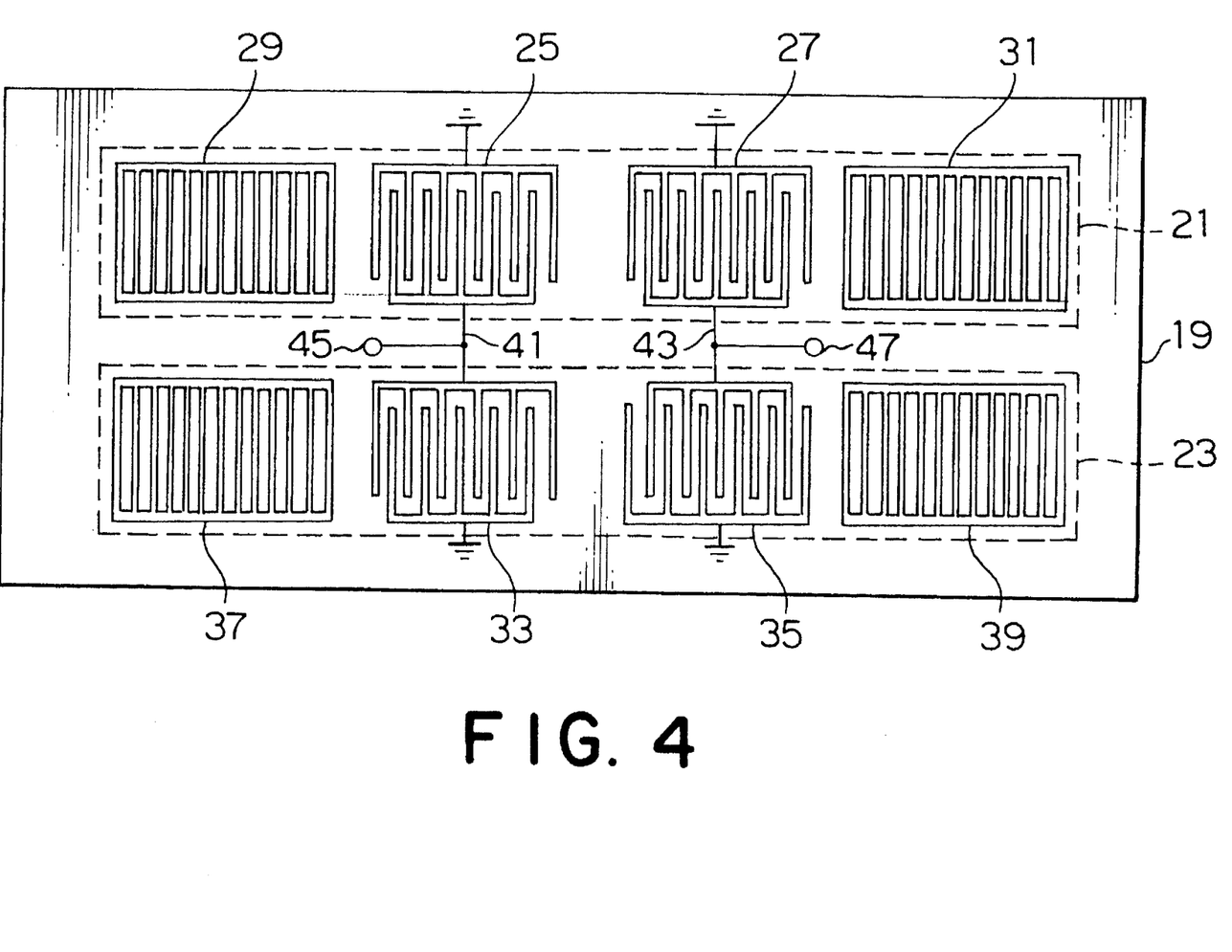
FIG. 4 is a schematic front view of a surface acoustic wave filter according to an embodiment of this invention.

Referring to FIG. 4, the description will now proceed to a surface acoustic wave filter according to a preferred embodiment of the present invention. As usual, the surface acoustic wave filter comprises a piezoelectric substrate 19 having a principal surface. The substrate 19 is preferably an ST-cut quartz substrate.

A pair of two-port triple-longitudinal-mode surface acoustic wave resonators are formed on the piezoelectric substrate 19 and will be referred to briefly as first and second surface acoustic wave resonators 21 and 23. These surface acoustic wave resonators 21 and 23 are geometrically parallel in the manner depicted topwardly and bottomwardly of the figure.

In the first surface acoustic wave resonator 21, a pair of first input and first output interdigital transducers 25 and 27 are formed on the piezoelectric substrate 19 centrally between left and right ends. It will be presumed merely for convenience of the description that the input interdigital transducer 25 is on the left side of the output interdigital transducer 27. In this manner, the input and the output interdigital transducers 25 and 27 are arranged in a predetermined direction which is horizontal in the figure.

A pair of first left and right grating reflectors 29 and 31 are formed on the piezoelectric substrate 19 outwardly of the input and the output interdigital transducers 25 and 27 in the predetermined direction. Similarly, the second surface acoustic wave resonator 23 comprises second input and second output interdigital transducers 33 and 35 and second left and right grating reflectors 37 and 39. Such left and right grating reflectors 29, 31, 37, and 39 are so called merely for designation.

In the example being illustrated, each of the input and the output interdigital transducers 25, 27, 33, and 35 comprises a plurality of pairs of interdigital electrodes. Each of the grating reflectors 29, 31, 37, and 39 comprises a plurality of grating electrodes.

In the first surface acoustic wave resonator 21, the input and the output interdigital transducers 25 and 27 are spaced apart by a first transducer space or distance S1t. Each of the input and the output interdigital transducers 25 and 27 is spaced from an adjacent one of the grating reflectors 29 and 31 by a first reflector space S1r. Likewise, the second input and the second output interdigital transducers 33 and 35 are spaced from each other by a second transducer space S2t. Each of the second input and output interdigital transducers 33 and 35 is spaced from an adjacent one of the second left and right grating reflectors 37 and 39 by a second reflector space S2r. Strictly speaking, the first or the second transducer space S1t or S2t is measured between center lines of ones of the interdigital electrodes that are nearest in the first or the second input and output interdigital transducers 25 or 33 and 27 or 35. The first or the second reflector space S1r or S2r is a measure between center lines of one of the interdigital electrodes and one of the grating electrodes that are nearest in one of the interdigital transducers 25, 27, 33, and 35 and in a pertinent one of the grating reflectors 29, 31, 37, and 39.

In the interdigital transducers 25, 27, 33, and 35, the interdigital electrodes, one in each pair, are grounded. In the first and the second input interdigital transducers 25 and 33, the interdigital electrodes, each different from the above-mentioned one in the pair, are connected together by an input signal line 41. In the first and the second output interdigital transducers 27 and 35, the interdigital electrodes, different from those grounded, are connected together by an output signal line 43. In this manner, the first and the second surface acoustic wave resonators 21 and 23 are electrically connected parallel.

In the illustrated example, the input and the output signal lines 41 and 43 are connected directly to filter input and output terminals 45 and 47. The interdigital and the grating electrodes are formed of aluminium or an aluminium alloy on the principal surface of the piezoelectric substrate 19 to an electrode film thickness of about 0.2 micrometer.

Each of the first and the second surface acoustic wave resonators 21 and 23 is subjected to the triple longitudinal modes of resonance of the first through the third types as described in the Yamamoto article. The first and the second surface acoustic wave resonators 21 and 23 are made to have their passbands as lower and higher frequency passbands in lower and higher frequency ranges in the manner which will become clear as the description proceeds.

Referring afresh to FIGS. 5 and 6 and again to FIG. 4, the frequencies F are scaled along the abscissa between 247.95 and 248.95 MHz. The losses L are scaled along the ordinates between −4 dB and −24 dB. In the manner described in conjunction with FIG. 1 at (A), the lower frequency passband of the first surface acoustic wave resonator 21 has the first through the third lower frequency peaks 11L, 13L, and 15L. As described with reference to FIG. 1 at (B), the higher frequency passband of the second surface acoustic wave resonator 23 has the first through the third higher frequency peaks 11H, 13H, and 15H.

Figure 5:
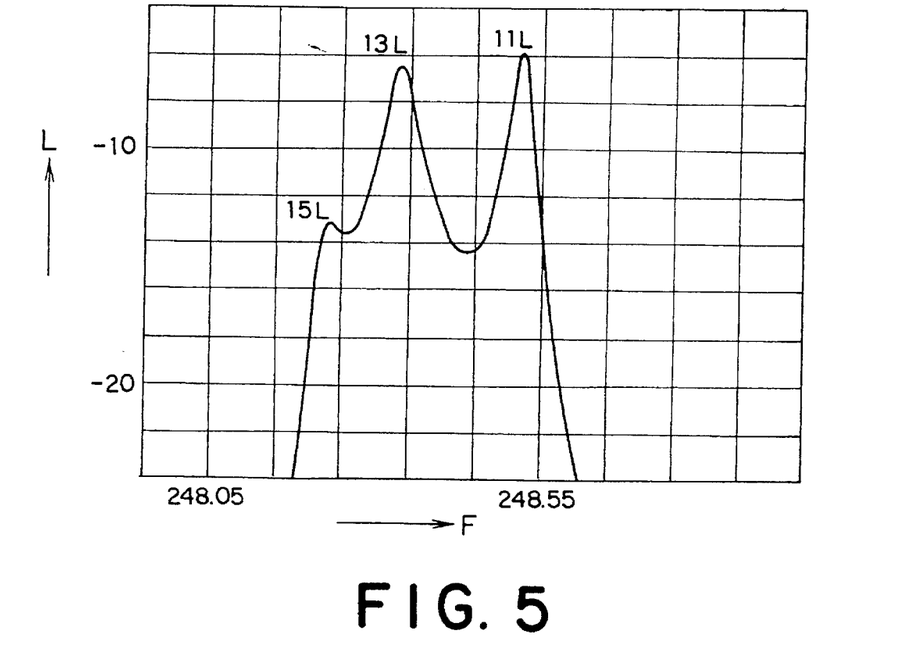
FIG. 5 shows a result of computer simulation of a lower frequency characteristic of the surface acoustic wave filter depicted in FIG. 4.
Figure 6:
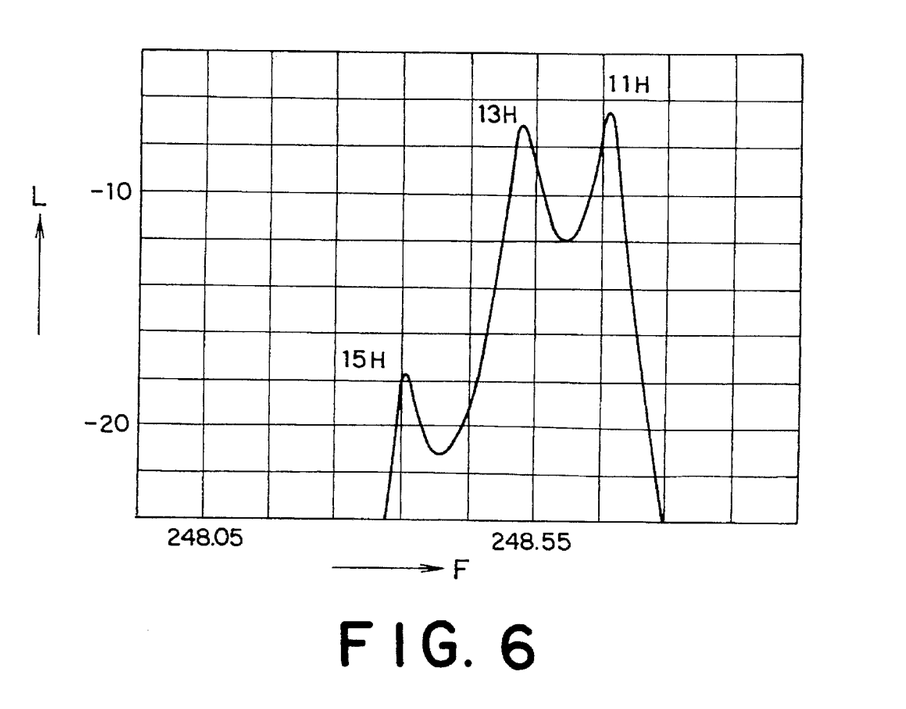
FIG. 6 shows a result of computer simulation of a higher frequency characteristic of the surface acoustic wave filter depicted in FIG. 4.

Attention will be directed to two frequencies of the first and the second lower frequency peaks 11L and 13L and to two frequencies of the second and the third higher frequency peaks 13H and 15H. Being higher in frequency in the lower frequency passband, the first-mentioned frequencies are referred to herein as two higher resonance frequencies and are higher in frequency than the third lower frequency peak 15L. The last-mentioned frequencies are herein called two lower resonance frequencies which are lower in frequency than the first higher frequency peak 11H although such frequencies are included in the higher frequency passband.

It is possible by selection of the design parameters to bring the lower resonance frequencies into substantial coincidence with the higher resonance frequencies, respectively. When the resonance frequencies are so brought into coincidence, the surface acoustic wave filter has a composite passband into which the lower and the higher frequency passbands are combined and in which the first higher frequency peak 11H produces a first composite resonance peak, the first lower frequency peak 11L and the second higher frequency peak 13H are composed into a second composite resonance peak, the second lower frequency peak 13L and the third higher frequency peak 15H are combined into a third composite resonance peak, and the third lower frequency peak 15L serves as a fourth composite resonance peak.

Turning to FIGS. 7 and 8 and FIGS. 4 through 6 continuously referred to, the frequencies F are scaled along the abscissa between 247.95 and 248.95 MHz as in FIGS. 5 and 6. The losses L are scaled along the ordinate between 0 dB and −20 dB.

Figure 7:
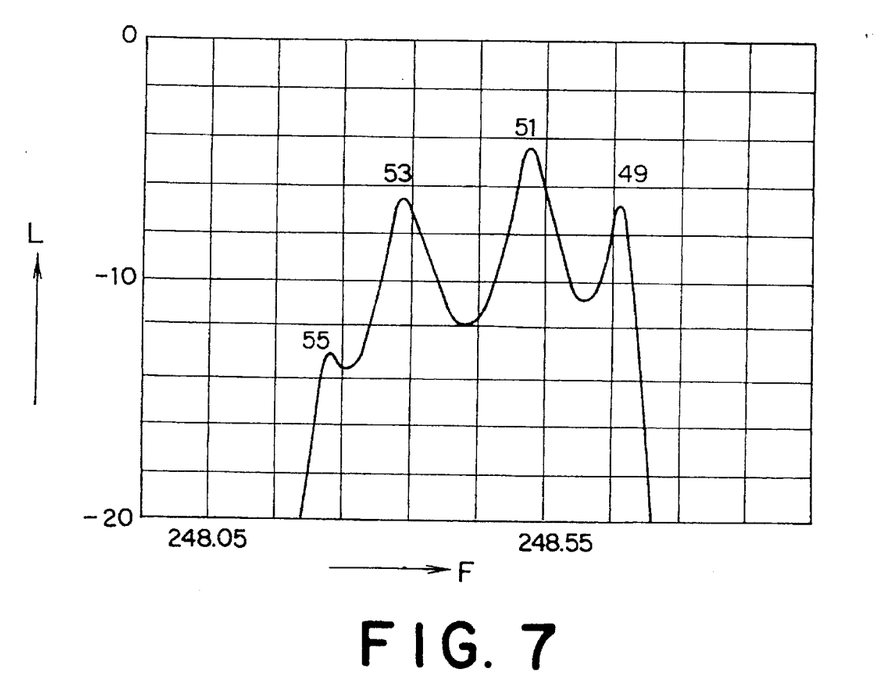
FIG. 7 shows a result of computer simulation of an overall characteristic of the surface acoustic wave filter illustrated in FIG. 4.

In FIG. 7, the composite passband is simulated for the surface acoustic wave filter illustrated with reference to FIG. 4, namely, without a matching circuit used. The first through the third resonance peaks are indicated at 49, 51, 53, and 55. It is appreciated that the first composite peak 49 is lower in height than the second composite resonance peak 51. The third composite resonance peak 53 is similarly lower. The fourth composite resonance peak 55 is now included in the composite passband rather than in the rejection band adjacent to the passband to give a spurious resonance peak in the passband of the surface acoustic wave filter being illustrated. The fourth composite resonance peak 55 has, however, a very low height. The composite passband is wide and is smooth and excellent. No spurious resonance peaks are preset in the rejection band near the passband.

Figure 8:
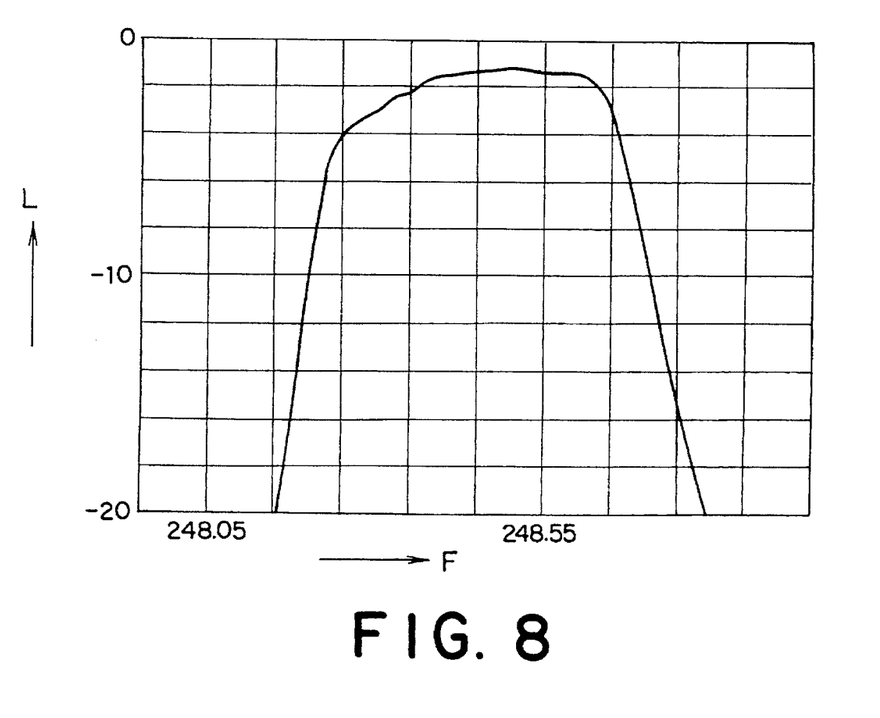
FIG. 8 shows a result of computer simulation of an overall characteristic of a surface acoustic wave filter which is depicted in FIG. 4 and to which a matching circuit is added.

In FIG. 8, the composite passband is simulated with a matching circuit added in the manner described in the Watanabe et al United States patent to the surface acoustic wave filter illustrated with reference to FIG. 4. The composite passband includes no spurious resonance peak which results from the fourth composite resonance peak 55 described in conjunction with FIG. 7.

Reviewing FIG. 4, electrically parallel connection of the first and the second surface acoustic wave resonators 21 and 23 will be described more in detail. In the first and the second input and output interdigital transducers 25, 27, 33, and 35, the interdigital electrodes of the pairs will be called as upwardly extended electrodes and downwardly extended electrodes. The modifiers "upwardly" and "downwardly" refer to the figure and are used merely for convenience of reference.

In the illustrated example, the downwardly extended electrodes of the first input and output interdigital transducers 25 and 27 and the upwardly extended electrodes of the second input and output interdigital transducers 33 and 35 are grounded or common connected. The upwardly extended electrodes of the first output interdigital transducer 25 and the downwardly extended electrodes of the second input interdigital transducer 33 are connected to the input signal line 41. The upwardly extended electrodes of the first output interdigital transducer 27 and the downwardly extended electrodes of the second output interdigital transducer 35 are connected to the output signal line 43.

Reviewing FIGS. 4 through FIG. 8, the two higher resonance frequencies of the first and the second lower frequency peaks 11L and 13L are brought into substantial coincidence with the two lower resonance frequencies of the second and the third higher frequency peaks 13H and 15H by optimum choice of the design parameters or resonance conditions, such as the number of pairs in each of the first and the second input and output interdigital transducers 25, 27, 33, and 35 and the first and the second transducer and reflector spaces S1t, S2t, S1r, and S2r.

By way of example, results of FIGS. 5 through 8 were obtained with the ST-cut quartz substrate used as the piezoelectric substrate 19 and with aluminium interdigital and grating electrodes formed in the principal surface to the above-mentioned electrode film thickness of 0.2 micrometer. In each of the first and the second input and output interdigital transducers 25, 27, 33, and 35, the number of pairs was 500. In the first surface acoustic wave resonator 21, the transducer space S1t and the reflector space S1r were $(½+n/2)d$ and $(¼+n/2)d$ wide, where d represents a distance between two adjacent ones of the interdigital electrodes in the predetermined direction, n representing zero or a positive integer. In the second surface acoustic wave resonator 23, the transducer and the reflector spaces S2t and S2r were $(21/48+n/2)d$ and $(1/12+n/2)d$ wide.

Incidentally, it is understood from the Yamamoto article in connection with each of the first and the second surface acoustic wave resonators 21 and 23 that a narrower transducer space S1t or S2t than the half surface wavelength widens a frequency difference between the first and the second resonance peaks, such as 11L and 13L or 11H and 13H, and that a wider reflector space S1r or S2r than the half surface wavelength widens another frequency difference between the second and the third resonance peaks, such as 13L and 15L or 13H and 15H. It is of course possible to empirically decide the first and the second transducer and reflector spaces.

While this invention has thus far been described in specific conjunction with a single preferred embodiment thereof, it will now be readily possible for one skilled in the art to put this invention into practice in various other manners. Above all, it is possible to use weighted electrodes in the manner described in the Yamamoto article and the selective withdrawal of interdigital electrodes as described in the Yamamoto article and in detail in the Watanabe et al United States patent. The pairs of interdigital electrodes consequently refers also to such selectively withdrawn or subsampled interdigital electrodes.

What is claimed is:

1. A surface acoustic wave filter comprising:
   a first two-port triple-mode surface acoustic wave resonator and a second two-port triple-mode surface acoustic ways resonator geometrically arranged and electrically connected in parallel with one another on a piezoelectric substrate, each of said first and second resonator comprising an input interdigital transducer and an output interdigital transducer oriented in a predetermined direction and a pair of grating reflectors outwardly of said input and said output interdigital transducers in said predetermined direction, each of said first and second resonators having a lower, a middle and a higher resonance frequency;
   wherein said middle and higher resonance frequencies of said first resonator are in substantial coincidence with said lower and said middle resonance frequencies of said second resonator, to thereby smooth the filter pass band and attenuate spurious resonance peaks near the pass band.

2. A surface acoustic wave filter as claimed in claim 1, each of said two-port triple-mode surface acoustic wave resonators being subjected to triple longitudinal modes of resonance at first, second, and third resonance peaks in a descending order of frequencies, said first resonator having a lower frequency passband comprising its first and second resonance peaks at its middle and higher resonance frequencies, said second resonator having a higher frequency passband comprising its second and third resonance peaks at its lower and middle resonance frequencies, wherein said first and second resonators have a composite passband composed of said lower and said higher frequency passbands.

3. A surface acoustic wave filter as claimed in claim 2, wherein said composite passband comprises first, second, third, and fourth resonance peaks, said first composite resonance peak being given by the first resonance peak of said higher frequency passband, said second composite resonance peak being composed of the first resonance peak of said lower frequency passband and the second resonance peak of said higher frequency passband, said third composite resonance peak being composed of the second resonance peak of said lower frequency passband and the third resonance peak of said higher frequency passband, said fourth composite resonance peak being given by the third resonance peak of said lower frequency passband.

4. A surface acoustic wave filter as claimed in claim 2, wherein said composite passband includes a frequency of the third resonance peak of said lower frequency passband.

5. A surface acoustic wave filter as claimed in claim 1, each of the input and the output interdigital transducers of said two-port triple-mode surface acoustic wave resonators comprising interdigital electrodes in pairs perpendicularly of said predetermined direction as upwardly and downwardly extended electrodes, wherein ones of said upwardly and said downwardly extended electrodes of the input and the output interdigital transducers of said two-port triple-mode surface acoustic wave resonators are common connected, the others of said upwardly and said downwardly extended electrodes of the input interdigital transducers of said two-port triple-mode surface acoustic wave resonators being connected to a common input signal line, the others of said upwardly and said downwardly extended electrodes of the output interdigital transducers of said two-port triple-mode surface acoustic wave resonators being connected to a common output signal line.

6. A surface acoustic wave filter as claimed in claim 1, wherein said middle and higher resonance frequencies of the first resonator are brought into substantial coincidence with said lower and middle resonance frequencies of the second resonator by optimum choice of design parameters of said two-port triple-mode surface acoustic wave resonators.

7. A surface acoustic wave filter as claimed in claim 6, each of the input and the output interdigital transducers of said two-port triple-mode surface acoustic wave resonators comprising interdigital electrodes in pairs perpendicularly of said predetermined direction, wherein said design parameters are numbers of said pairs in the input and the output interdigital transducers of said two-port triple-mode surface acoustic wave resonators, first transducer and first reflector spaces between the input and the output interdigital transducers and between one of the input and the output interdigital transducers and an adjacent one of the grating reflectors in one of said pair of two-port triple-mode surface acoustic wave resonators, and second transducer and second reflector spaces between the input and the output interdigital transducers and between one of the input and the output interdigital transducers and an adjacent one of the pair of grating reflectors in the other of said two-port triple-mode surface acoustic wave resonators.

8. A surface acoustic wave filter as claimed in claim 7, wherein the number of pairs is 500 in each of the input and the output interdigital transducers of each of said two-port triple-mode surface acoustic wave resonators, said first transducer and reflector spaces and said second transducer and reflector spaces being equal to $(½+n/2)d$, $(¼ +n/2)d$, $(21/48+n/2)d$, and $(1/12+n/2)d$, respectively, where d represents a distance between two adjacent ones of said interdigital electrodes, n representing one of zero and positive integers.

* * * * *